United States Patent
Morgan et al.

(10) Patent No.: US 12,155,380 B2
(45) Date of Patent: Nov. 26, 2024

(54) DRIVER CIRCUITRY AND OPERATION

(71) Applicant: Cirrus Logic International Semiconductor Ltd., Edinburgh (GB)

(72) Inventors: Ross C. Morgan, Bathgate (GB); Yongjie Cheng, Austin, TX (US); Lingli Zhang, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/188,053

(22) Filed: Mar. 22, 2023

(65) Prior Publication Data

US 2024/0322817 A1 Sep. 26, 2024

(51) Int. Cl.
*H03K 17/687* (2006.01)
*H03K 17/06* (2006.01)

(52) U.S. Cl.
CPC ....... *H03K 17/6871* (2013.01); *H03K 17/063* (2013.01); *H03K 2217/0045* (2013.01)

(58) Field of Classification Search
CPC ............. H03K 17/6871; H03K 17/063; H03K 2217/0045
See application file for complete search history.

(56) References Cited

U.S. PATENT DOCUMENTS

2008/0197907 A1* 8/2008 Wang .................. H03F 3/21 327/333
2018/0376252 A1* 12/2018 King ................... H04R 17/00

* cited by examiner

*Primary Examiner* — Metasebia T Retebo
(74) *Attorney, Agent, or Firm* — Jackson Walker L.L.P.

(57) ABSTRACT

This application relates to methods and apparatus for driving a transducer connected between two output nodes in a bridge-tied-load configuration. A driver receives first and second supply voltages and has charge pumps that generate respective first and second boosted voltages. The driver is operable in a first driver mode in which each output node is modulated between the first and second supply voltage; a second driver mode in which one output nodes is modulated between the first and second supply voltages and the other output node is modulated between either the first boosted voltage and the first supply voltage or between the second supply voltage and the second boosted voltage; and a third driver mode in which one of the output nodes is modulated between the first supply voltage and the first boosted voltage and the other output node is modulated between the second supply voltage and the second boosted voltage.

19 Claims, 3 Drawing Sheets

DRIVER CIRCUITRY AND OPERATION

TECHNICAL FIELD

The field of representative embodiments of this disclosure relates to methods, apparatus and/or implementations concerning or relating to driver circuits, and in particular to switching driver circuits as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuitry may include a switching amplifier stage, e.g. a class-D amplifier output stage or the like, for generating the drive signal. Switching amplifier stages, sometimes referred to as switched-mode amplifiers, can be relatively power efficient and thus can be advantageously used in some applications. A switching amplifier stage generally operates to switch an output node between high-side and low-side switching voltages, with a duty cycle that provides a desired average output voltage over the course of the duty cycle for the drive signal.

A switching driver may be arranged to drive a load, e.g. a transducer, in a single-ended configuration, in which the driver generates a modulated drive signal at a driver output node to drive one side of the load, whilst the other side of the load is held at a fixed DC voltage, which may, for instance be a midpoint voltage of the output range of the switching driver. Alternatively, in some cases a switching driver may be arranged to drive the load in a bridge-tied-load configuration, where each side of the load is driven, via a respective driver output node, with a modulated drive signal to generate a desired voltage difference across the load.

In either case, the, or each, driver output node may conventionally be switched between fixed switching voltages, e.g. defined high-side and low-side voltages VH and VL that do not substantially vary in use, in which case the high-side and low-side voltage VH and VL will be set to provide a desired output range for the average voltage at each driver output node.

In at least some applications it may be desirable to generate drive signals with relatively high amplitudes. This may therefore typically require the voltage difference between the defined high-side and low-side voltages VH and VL, to be relatively high to provide the required output range. For instance, in some audio applications there can be a desire to generate audio driving signals with a relatively high output power. Additionally or alternatively, piezoelectric or piezo transducers or ceramic transducers are increasingly being proposed for use in some applications, especially for portable electronic devices such as mobile telephones, laptop and tablet computers and the like, due to their thin form factor, and such transducers may require relatively high driving voltages, say of the order of tens of volts or so.

Using high driving voltages can, however, result in relatively large voltages stresses across the switches of the driver, which may require the use of devices with high voltage tolerances, which may not be practical for some applications, or which may add to the cost of the circuitry.

Also, in this case the output node will be switched, in each switching cycle, between the high-side and low-side voltages which define the full output range of the driver circuit. As will be understood by one skilled in the art, the variation in voltage at the output node over the switching cycle can impact load current ripple and the amount of EMI (electromagnetic interference) generated in use, which it may be beneficial to minimise.

In some instances therefore it may be advantageous to implement the switching driver as a multi-level switching driver, where the switching voltages that the output node is switched between may be varied in use. Embodiments of the present disclosure thus relate to improved driving circuits.

SUMMARY

According to an aspect of the disclosure there is provided a driver apparatus for driving a transducer in a bridge-tied-load configuration based on an input signal comprising: first and second input nodes for receiving first and second supply voltages respectively defining an input voltage; a first charge pump configured to generate a first boosted voltage which is positively boosted from the first supply voltage and a second charge pump configured to generate a second boosted voltage which is negatively boosted from the second supply voltage. The driver apparatus comprises an output bridge stage with first and second driver output nodes for connection to opposite sides of the load, wherein the output bridge stage comprises a switch network for selectively connecting each of the first and second driver output nodes to any of the first supply voltage, the second supply voltage, the first boosted voltage or the second boosted voltage; and a controller configured to control the switch network of the output bridge stage. The controller is configured to selectively operate in each of: a first driver mode in which each of the first and second output nodes is modulated between the first and second supply voltage; a second driver mode in which one of the first and second output nodes is modulated between the first and second supply voltages and the other of the first and second output nodes is modulated between either the first boosted voltage and the first supply voltage or between the second supply voltage and the second boosted voltage; and a third driver mode in which one of the first and second output nodes is modulated between the first supply voltage and the first boosted voltage and the other of the first and second output node is modulated between the first supply voltage and the second boosted voltage. The controller is configured to control the driver mode and a duty cycle of the modulation in said driver mode based on the input signal.

In some implementations, in the second driver mode, one of the first and second output nodes may be modulated between the first and second supply voltages and the other of the first and second output nodes may be modulated between the second supply voltage and the second boosted voltage. In some examples the controller may be further operable to control the switch network of the output bridge stage to selectively operate in an alternative second driver mode in which one of the first and second output nodes is modulated between the first and second supply voltages and the other of the first and second output nodes is modulated between the first boosted voltage and the first supply voltage.

In some implementations, the first charge pump may be configured to be operable, in use, with a first flying capacitor and a first hold capacitor and the second charge pump may be configured to be operable, in use, with a second flying capacitor and a second hold capacitor. Each of the first and second charge pumps may be configured to be operable in a charge state in which the respective first or second reservoir capacitor is charged to the input voltage and a refresh state in which the respective first or second reservoir capacitor is connected in series with the appropriate first or second supply voltage to generate the respective first or second boosted voltage at an output of the charge pump. The first hold capacitor may be connected between the output of the first charge pump and the first supply voltage.

In some implementation a charge pump switching frequency of the first charge pump may be, in used, different to a charge pump switching frequency of the second charge pump.

The controller may be configured to controllably vary a charge pump switching frequency of at least one of the first and second charge pumps.

The controller may be configured to control at least one of the first and second charge pumps such that, in at least one driver mode in which the relevant first or second boosted voltage is not used as a modulation voltage, a switching frequency of the first or second charge pump is lower than in a driver mode in which the relevant first or second boosted voltage is used as a modulation voltage. The controller may additionally or alternatively be configured to control at least one of the first and second charge pumps such that, in at least one driver mode in which the relevant first or second boosted voltage is not used as a modulation voltage, the first or second charge pump is deactivated. The controller may be configured to control activation of the at least one of the first and second charge pumps based on an indication of a look-ahead of the signal level of the input signal.

In some examples, the switch network of the output bridge stage may comprise, for each of the first and second output nodes, a first switch for selectively connecting the output node to a first rail node, a second switch for selectively connecting the output node to the second supply voltage and a third switch for selectively connecting the output node to a second rail node, wherein the second rail node is connected to an output of the second charge pump and the switch network of the output bridge further comprises switches for selectively connecting the first supply voltage or an output of the first charge pump to the first rail node.

In some implementations, the first supply voltage may be a positive supply voltage equal to VP and the second supply voltage may be a ground voltage. The first boosted voltage may be nominally equal to +2VP and the second boosted voltage may be nominally equal to −VP.

The driver apparatus may be an audio driver apparatus for driving an audio output transducer based on an audio input signal. The driver apparatus may be implemented as an integrated circuit. The driver apparatus may be implemented as part of an electronic device.

In another aspect there is provided a driver apparatus for driving a load based on an input signal comprising: first and second supply nodes for connection to first and second supply voltages defining an input voltage; first and second charge pumps for generating, in use, first and second charge pump voltages that are different from the first and second supply voltages and which differ from the first and second supply voltages respectively by an amount equal to the input voltage; first and second driver output nodes for connection to opposite sides of the load; a controller configured to selectively modulate each of the first and second driver output nodes between selected switching voltage with a controlled duty cycle wherein the switching voltages for each of the first and second output nodes can be selected any of: the first charge pump voltage and the first supply voltage; the first supply voltage and the second supply voltage; or the second supply voltage and second charge pump voltage.

In a yet further aspect there is provided a driver apparatus for driving a transducer based on an input signal comprising: first and second supply nodes for connection to first and second supply voltages defining an input voltage; first and second charge pumps for generating, in use, first and second charge pump voltages that are different from the first and second supply voltages; a controller configured to selectively modulate at least one driver output node between selected ones of the first charge pump voltage, the first supply voltage, the second supply voltage and the second charge pump voltage.

It should be noted that, unless expressly indicated to the contrary herein or otherwise clearly incompatible, then any feature described herein may be implemented in combination with any one or more other described features.

BRIEF DESCRIPTION OF DRAWINGS

For a better understanding of examples of the present disclosure, and to show more clearly how the examples may be carried into effect, reference will now be made, by way of example only, to the following drawings in which.

DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to driver circuitry for driving a transducer and to methods of operation of driver circuitry.

At least some embodiments of the present disclosure relate to switching drivers for generating a drive signal for driving a load such as a transducer. The switching driver has at least one driver output node, where, in use, the output node is modulated between different switching voltages with a controlled duty-cycle and where the switching voltages may be different in different driver operating modes. The overall output voltage range for the switching driver may thus be defined by the different driver modes of operation, and each individual driver mode of operation may provide only part of the overall output voltage range, that is, the voltage range between the two switching voltages in a given mode forms only a part or a subset of the overall output voltage range (for that driver output node). In embodiments of the disclosure, the switching driver receives first and second supply voltages defining an input voltage and comprises first and second charge pumps for generating first and second boosted voltages from the first and second supply voltages. Each output node can be switched, in use, with a controlled duty cycle between selected ones of the first boosted voltage, first supply voltage, second supply voltage or second boosted voltage.

Figure 1:
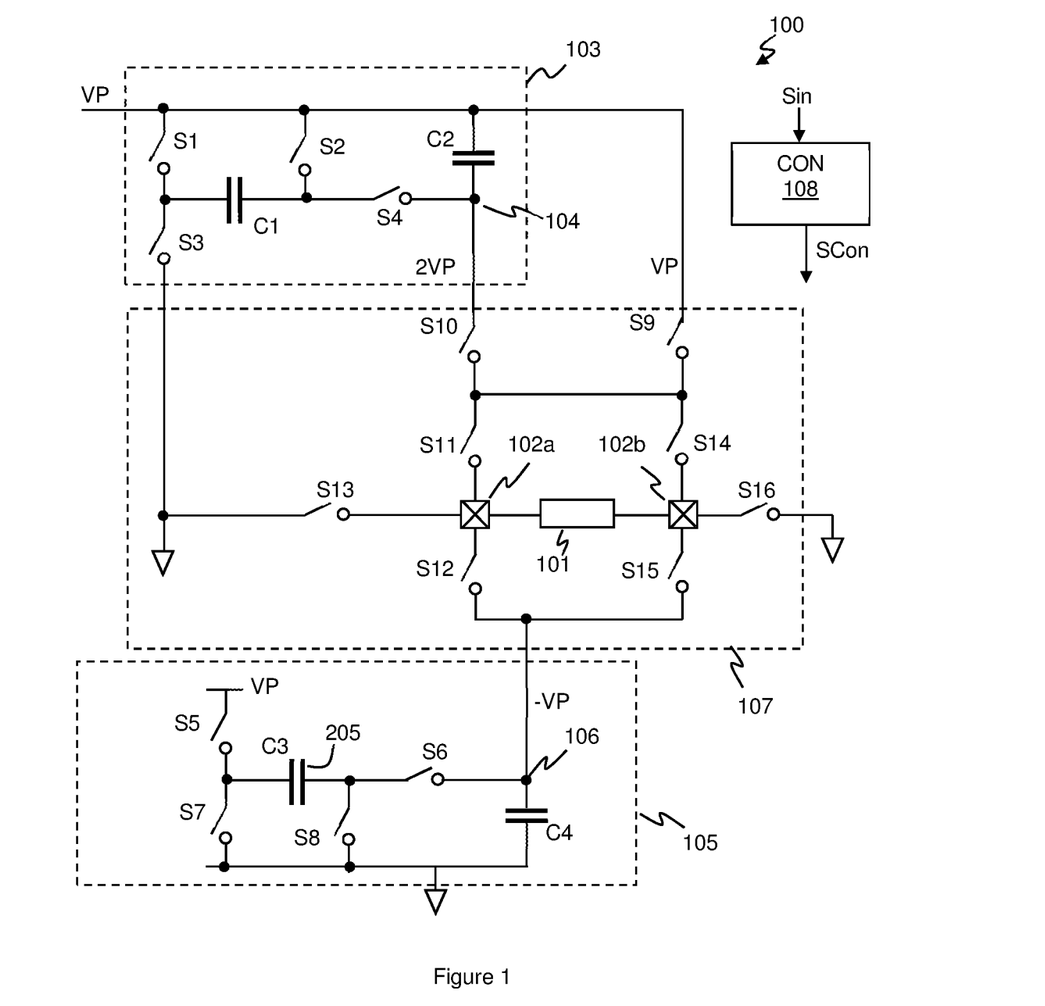
FIG. 1 illustrates in general a driver apparatus according to an embodiment.

FIG. 1 illustrates one embodiment of a switching driver 100 according to an embodiment. The example of FIG. 1 is a switching driver 100 for driving a load 101, such as a transducer, in a bridge-tied-load (BTL) configuration and, the switching driver 100 thus has first and second output nodes 102a and 102b for connection to opposite sides of the load 101. In use, the switching driver 100 modulates each of the first and second output nodes 102a and 102b between selected switching voltages with a controlled duty-cycle so as to generate a differential output signal across the load based on an input signal Sin.

The embodiment of FIG. 1 receives first and second supply voltages, which in this example are a positive supply voltage VP and ground. For the voidance of doubt, as used in this disclosure the term supply voltage can include a ground voltage, i.e. 0V (zero volts) and references to receiving a supply voltage will cover receiving a defined ground voltage. The first and second supply voltages define the input voltage, Vin, which in this example is equal to VP.

The switching driver 100 comprises a first charge pump 103 which is configured, in use, to provide a first boosted voltage at an output node 104 which is different to the first and second supply voltages. As will be understood by one skilled in the art, a charge pump is a capacitor-based DC-DC converter for generating an output voltage with a defined relationship to the input voltage for the charge pump. In this example, the first charge pump 103 is arranged to positively boost the first supply voltage VP by an amount equal to the input voltage Vin=VP and so generates, in use, an output voltage of +2VP.

The first charge pump comprising a flying capacitor C1 and a hold or reservoir capacitor C2. A switch network is configured so that the flying capacitor C1 can be selectively connected to be charged by the input voltage in a charging state, so the voltage across the capacitor becomes equal to input voltage, i.e. equal to VP, and then used in a refresh state to generate the voltage 2VP at the output node. In this example, the charge pump switch network comprises four switches S1 to S4, with switches S1 and S3 selectively connecting a first electrode of the flying capacitor C1 to the first and second supply voltages respectively and switches S2 and S4 for selectively connecting the second electrode of the flying capacitor C1 to the first supply voltage or the output node 104 respectively. Switches S2 and S3 may be closed together (with S1 and S4 open) to provide the charging state and switches S1 and S4 may be closed (with S2 and S3 open) to provide the refresh state. The hold capacitor C2 is connected between the output node 104 and one of the first and second supply voltages. In the example of FIG. 1 the hold capacitor is connected between the first supply voltage VP and the output node 104 and thus, in use, the voltage across the hold capacitor C2 is also equal to the input voltage, in this example VP.

The switching driver 100 also comprises a second charge pump 105 which is configured, in use, to provide a second boosted voltage at an output node 106, which is different to any of the first or second supply voltages or the first boosted voltage. In this example, the second charge pump 105 is arranged to negatively boost the second supply voltage, ground in this example, by an amount equal to the input voltage Vin=VP and so generates an output voltage of −VP. Note that as used herein, the term negatively boost in relation to operation shall mean that the output voltage generated by the charge pump is more negative/less positive than the relevant supply voltage (and likewise the term positively boost shall mean that the output voltage generated by the charge pump is more positive/less negative than the relevant supply voltage).

The second charge pump 105 also comprises a flying capacitor C3 and a hold or reservoir capacitor C4 and a network of switches, in this case four switches S5 to S8, where switches S5 and S7 selectively connect a first electrode of the flying capacitor C3 to the first or second supply voltages respectively and switches S6 and S8 selectively connect the second electrode of the flying capacitor C3 to the first supply voltage or the output node 106 respectively. Switches S5 and S8 may be closed together (with S6 and S7 open) to provide a charging state to charge the flying capacitor to the input voltage Vin=VP, and switches S7 and S6 may be closed (with S5 and S8 open) to provide a refresh state with a voltage-VP generated at the output node 106. The hold capacitor C4 is connected between the output node 106 and one of the first and second supply voltages. In the example of FIG. 1, the hold capacitor C4 is connected between the second supply voltage, ground, and the output node 106 and thus, in use, the voltage across the hold capacitor C4 is also equal to the input voltage, in this example VP.

The first and second charge pumps 103 and 105 in the example of FIG. 1 thus each comprise just four switches and two capacitors, and thus can be relatively small in area. It will be understood, however, that other designs of charge pump could be used in some applications.

The switching driver 100 also comprises an output bridge stage 107. The output bridge stage 107 comprises a network of switches for selectively connecting each of the output nodes 102a and 102b to any of the first supply voltage, the second supply voltage, the first boosted voltage output from the first charge pump 103 or the second boosted voltage output from the second charge pump 105.

In the example of FIG. 1, switches S9 and S10 are configured to selectively provide either the first supply voltage VP or the first boosted voltage 2VP as a high side voltage, to a node or rail, which will be referred to herein as a high-side voltage rail. The second boosted voltage, −VP is also provided to the output bridge stage 107, to what will be referred to as a low-side rail. The first output node 102a can be selectively connected to the high-side rail by switch S11, the low-side rail by switch S12 or separately to the second supply voltage, i.e. ground in this example, by a switch S13. Likewise the second output node 102b can be selectively connected to the high-side rail, low-side rail or second supply voltage by switches S14, S15 or S16 respectively.

Thus, in the example of FIG. 1, each output node can be selectively connected to any of the voltages of +VP, ground, +2VP or −VP. The switching driver 100 is able to generate a drive voltage across the load 101 with a maximum magnitude of 3VP, with one output node connected to 2VP and the other output node to −VP. Output voltages in the output range of +3VP to −3VP can be generated by switching the output nodes between selected switching voltages with appropriate duty-cycles. However, for any given switching cycle, the switching voltages that each output node is modulated between can differ from one another by an amount which is less than 3VP and, advantageously, each output node may, at any time, be modulated between two switching voltages that differ from one another by VP, i.e. by an amount equal to the input voltage. The full output range from +3VP to −3VP can be achieved by operating the switching driver 100 in different modes, depending on the level of the input signal Sin and hence the required output drive signal.

The output bridge stage 107 is thus controlled by controller 108, to controllably switch the first and second output nodes 102a and 102b between selected switching voltages with controlled duty-cycles so as to generate a differential drive signal across the load (on average over the course of a switching cycle) based on the input signal Sin.

In one implementation the switching driver may be operable in at least three main modes.

In a first mode of operation, which may be considered as a low signal level mode of operation and which will be referred to herein as Mode 1, each of the first and second output nodes 102a and 102b may be switched between the same switching voltages as one another, which may conveniently be the first and second supply voltages, i.e. VP and 0V (ground) in this example. Thus, each of the first and second output nodes may be switched between VP and 0V, with an appropriate duty cycle, to generate an output voltage across the load in the range of +VP to −VP. In this mode of operation, switch S9 can be closed with switch S10 open throughout the switching cycle, to connect the high-side voltage rail to VP. Switches S12 and S15 are also open throughout the switching cycle. Switches S11 and S13 can be controlled in anti-phase with one another at an appropriate duty cycle for the first output node 102a. Likewise switches S14 and S16 can be controlled in anti-phase with one another with an appropriate duty cycle for the second output node 102b.

In another mode of operation, which may be seen as an intermediate signal level mode of operation, and which will be referred to herein as Mode 2a, one of the first and second output nodes (depending on the required polarity of the output drive signal) may be switched between the first and second supply voltages VP and 0V, whilst the other output node is switched between the second supply voltage 0V and the second boosted voltage −VP. This intermediate signal level Mode 2 can produce an output voltage across the load of a magnitude up to 2VP.

In Mode 2a, switch S9 may thus be closed (with S10 open) throughout the switching cycle, to connect the high-side rail to the first supply voltage VP. Depending on the required polarity of the output drive signal across the load, one of output nodes is switched with a controlled duty-cycle between the high-side rail and the ground and the other output node is switched with a controlled duty-cycle between ground and the low-side rail.

For the purposes of discussion herein, any reference to a positive voltage across the load 101 will be taken as meaning that the voltage at the first output node 102a is more positive/less negative than the voltage at the second output node 102b. Thus, to generate a positive voltage across the load, switches S11 and S13 could be switched in anti-phase with one another with a controlled duty cycle to modulate the first output node 102a between the voltage VP at the high-side rail and ground, whilst switches S16 and S15 switched in anti-phase with one another with a controlled duty cycle to modulate the second output node 102b between the ground and the voltage-VP at the low-side rail. Switches S12 and S14 will be open throughout the switching cycle. For a negative voltage across the load, the switching of the first and second output nodes would be swapped, i.e. the second output node 102b would be modulated between VP and ground by controlling switches S14 and S16 with an appropriate duty cycle whilst the first output node 102a switches between 0V and −VP by duty cycling switches S13 and S12. Thus, it can be seen that there are two sub-modes of Mode 2a, one for positive output voltage and one for negative output voltages.

In a further mode of operation, which can be seen as a high signal level mode of operation and which will be referred to herein as Mode 3, one of the first and second output nodes is switched between the first boosted voltage 2VP and the first supply voltage VP, whilst the other output node is switched between the second supply voltage 0V and the second boosted voltage −VP. This high signal level Mode 3 can produce an output voltage across the load of a magnitude up to 3VP.

In this mode of operation, the relevant output node that switches between 2VP and VP may be connected to the high-side rail throughout the switching cycle and switches S9 and S10 may be switched with a controlled duty cycle for the relevant output node so that the high-side rail is modulated between +2VP and +VP with the desired duty-cycle for the relevant output node. For example, for a positive output voltage, switch S11 may be closed throughout the switching cycle (with switches S12 and S13 open throughout the switching cycle) and the switches S10 and S9 may be switched in anti-phase with one another with a controlled duty-cycle based on the desired output from the first output node 102a. The second output node 102b is switched between 0V and −VP and thus switches S16 and S15 are controlled in anti-phase to one another with the required duty cycle (with S14 open throughout the switching cycle).

The mode of operation and duty cycle of the switching driver 100 is, in this example, controlled by the controller 108 based on the input signal Sin. For instance, the controller 108 may control the switching driver 100 to operate in the low signal level mode, Mode 1 for input signal magnitudes up to a first threshold, with an appropriate duty cycle to provide the appropriate output voltage across the load. The first threshold may correspond to an output voltage magnitude at or below VP. For input signals with a magnitude above the first threshold, but below a second, higher threshold, the controller 108 may control the switching driver 100 to operate in the intermediate signal level mode, Mode 2a, with appropriate switching for the required polarity, i.e. with operation in the relevant sub-mode. The second threshold may correspond to an output voltage magnitude at or below 2VP. For magnitudes of input signal above the second threshold, the controller 108 may control the switching driver 100 to operate in the high signal level mode, i.e. Mode 3, with appropriate switching for the required polarity. It will be understood that the first and second thresholds are magnitude thresholds and thus effectively provide separate positive and negative thresholds for signal level. That is, for signal levels between the first positive and first negative threshold, the switching driver 100 may operate in Mode 1, and switch to the relevant positive or negative sub-mode of Mode 2 depending on whether the relevant positive or negative first threshold is reached.

The switching driver 100 can thus provide an output voltage across the load in the range of +3VP to −3VP but in each switching cycle each output node is only switched between switching voltages that differ from one another by an amount equal to VP. This is beneficial in terms of reducing EMI compared to switching the output node by a voltage difference of 3VP as would otherwise be required to provide the same output range in a convention switching amplifier with fixed switching voltages.

This operation can also reduce the voltage stress across at least some of the switches in use, requiring a lower voltage standoff for the switches, as will be discussed in more detail below.

The controller 108 may thus control the duty cycle of the switching of the output bridge stage 107 within an operating mode based on the level of the input signal and swap between the different modes of operation as the input signal level crosses defined thresholds, possibly with some hysteresis applied to the thresholds.

In each mode, the duty-cycles for the first and second output nodes 102a and 102b (defined in terms of the proportion of the switching cycle that the relevant output node is switched to the more positive/less negative switching voltage) are controlled to provide the required output voltage across the load (over the course of the switching cycle). In Mode 1, for an output signal level of zero, the duty-cycles of both the first and second output nodes 102a and 102b will be controlled to be the same as one another so that each output node is driven to the same voltage (on average over the switching cycle) and the differential output voltage is zero. Typically this quiescent signal level may correspond to a duty-cycle of 50% for each of the output nodes and the duty-cycles of the first and second output nodes 102a and 102b may vary equally and oppositely with changes in signal level up to the first threshold (although other arrangements are possible). If the signal magnitude increases to the first threshold, the controller 108 controls the switching driver to switch to Mode 2a (with the relevant sub-mode for the required polarity as appropriate) and thus changes the switching voltages for one of the output nodes, with a corresponding change in duty-cycles for both the first and second output nodes to maintain the correct differential output voltage.

The first threshold could correspond to a magnitude of VP and the switching driver 100 could thus operate in Mode 1 until the duty-cycle for one of the first and second output nodes 102a and 102b was 100% and the duty-cycle for the other output node was 0%. In practice, however, the impact of the efficiency of the converter may mean that the maximum output in Mode 1 may be less than VP. In addition, it may be preferable to avoid very high or very low duty cycles at or very near 100% or 0% as the switching driver may be less efficient at extremes of duty-cycle and/or because of difficulties in achieving very short on or off times for the relevant switches. Thus, the first threshold magnitude may be lower than VP and the controller 108 may control the duty cycles of the first and second output nodes 102a and 102b within an operating range that has a maximum lower than 100% and/or a minimum greater than 0%. In this case, if the switching driver 100 is operating in Mode 1 and the first threshold is reached, the switching driver may swap from Mode 1 to Mode 2a and the duty-cycles for both output nodes will be adjusted accordingly to maintain the correct differential voltage, but with the duty-cycles being controlled to be within an acceptable operating range.

Purely for example, consider that the maximum duty-cycle is 90% and the minimum duty-cycle is 10%, so that the first threshold magnitude is substantially 0.8VP. Consider also that the level of the input signal increases positively from zero. In this case, the duty-cycle for the first output node 102a increases from 50% with increasing signal level, whilst the duty-cycle for the second output node 102 decreases from 50% by a corresponding amount. When the first threshold is reached, the first output node 102 will be at the maximum duty-cycle of 90% and the second output node 102b will have the minimum duty-cycle of 10%. The controller 108 will then control the switching driver 100 to switch to (the positive sub-mode of) Mode 2a and thus the switching voltages for the second output node 102b will become 0V and −VP. The duty cycles for the first and second output node 102a and 102b may be adjusted to account for the new switching voltages, whilst maintaining the correct differential voltage. In general, the duty-cycle of the first output node 102a (which was at the maximum of 90%) will be reduced by a first amount (i.e. to 90-N %) and the duty-cycle of the second output node (which was at the minimum of 10%) will be increased by a second amount (i.e. to 10+M %) and the first and second amounts (N+M) will substantially total 100%. Purely as an example, the duty-cycle for the first output node could be set at 40% and the duty-cycle for the second output node could be set at 60%—which may lead to the same differential output voltage of substantially 0.8VP as before the change in mode (but other adjustments of duty-cycle could be made). For further increases in positive signal level, the switching driver 100 may operate in Mode 2a, with the duty-cycle of the first output node 102a being increased and the duty-cycle of the second output node 102b being reduced, until the second threshold magnitude is reached, which may again correspond to a maximum duty cycle lower than 100% and/or minimum duty cycle higher than 0%. The controller 108 may then control the switching driver 100 to operate in Mode 3 with another appropriate change in duty-cycles to account for the change in switching voltages. Note that the operating range of duty-cycles that are actually used could be different in different modes based on the choice of thresholds.

In use, each of the first and second output nodes 102a and 102b thus switches between the relevant high (i.e. more positive/less negative) and low (less positive/more negative) switching voltages for the selected mode with the controlled duty-cycle. The output bridge stage 107 will be controlled to operate in a series of different phases, depending on timing of the relevant switch control signals. In general there may be four possible switch states for each mode, which correspond to (i) the first output node 102a being switched high whilst the second output node 102a is switched low, (ii) the first output node 102a being switched low whilst the second output node 102a is switched high, (iii) both the first and second output nodes 102a and 102b being switched high or (iv) both the first and second output nodes 102a and 102b being switched low. Depending on the relative timing of the switch control signals for the relevant switches in each mode, the switching cycle may comprise one or more phases of at least some of these switch states.

For example, when operating in Mode 1, for part of the switching cycle, both the first output node 102a and the second output node 102b may be switched to VP at the same time as one another. In the case of a positive output voltage, where the first output node 102a will be connected to VP for longer than the second output node 102b, the second output node 102b may be switched high to VP during a period in which the first output node 102b is switched high to VP. In this case, for a positive output signal, the switching cycle could comprise at least one phase when both the first and second output nodes 102a and 102b are switched to 0V (with switches S13 and S16 closed and S11 and S14 open), at least one phase where the first output node 102a is at VP (with switch S11 closed and S13 open) whilst the second output node 102b is at 0V (with switch S16 closed and S14 open) and at least one phase where both the first and second output nodes 102a and 102b are switched to VP (with switches S11 and S14 closed and S13 and S16 open). For a negative output signal, a period during which the first output node 102a is switched high to VP may occur during a period during which the second output node 102b is switched high to VP, and there may be at least one phase when the second output node 102b is switched high to VP whilst the first output node 102a is switched low to 0V (but there may not be a phase where the first output node 102a is switched high to VP whilst the second output node is switched low to 0V). Similar considerations apply to the other modes as would be understood by one skilled in the art.

In the embodiment of FIG. 1, the intermediate signal level mode, Mode 2a is provided by switching one of the first and second output nodes 102a and 102b between VP and 0V whilst the other output node is switched between 0V and −VP. Thus, in this intermediate signal level mode, one output node (the first output node 102a for a positive output voltage) is switched between the supply voltages, VP and 0V, and the other output node (the second output node 102b for a positive output voltage) is switched between the supply voltage 0V and the boosted voltage-VP. It would, however, be possible to implement an alternative intermediate signal level mode using the other boosted voltage, i.e. 2VP, instead. In that case, one of the output nodes (the first output node 102a for a positive output voltage) would be switched between 2VP and VP whilst the other output node (the second output node 102b for a positive output voltage) is switched between the supply voltage VP and 0V. This alternative intermediate signal level mode will be referred to herein as Mode 2b. Like Mode 2a, the alternative Mode 2b can provide an output voltage across the load up to a magnitude of 2VP.

In the embodiment of FIG. 1, as both the first and second output nodes 102a and 102b selectively connect to a common high-side rail, it would not be possible for the first output node 102a to be switched to the boosted voltage 2VP at the same time that the second output node 102b is switched to the supply voltage VP (or vice versa) and thus the switching arrangement discussed above, where both output nodes may be switched to their respective high switching voltage at the same time, could not be implemented (although other switching arrangements could be possible).

Figure 2:
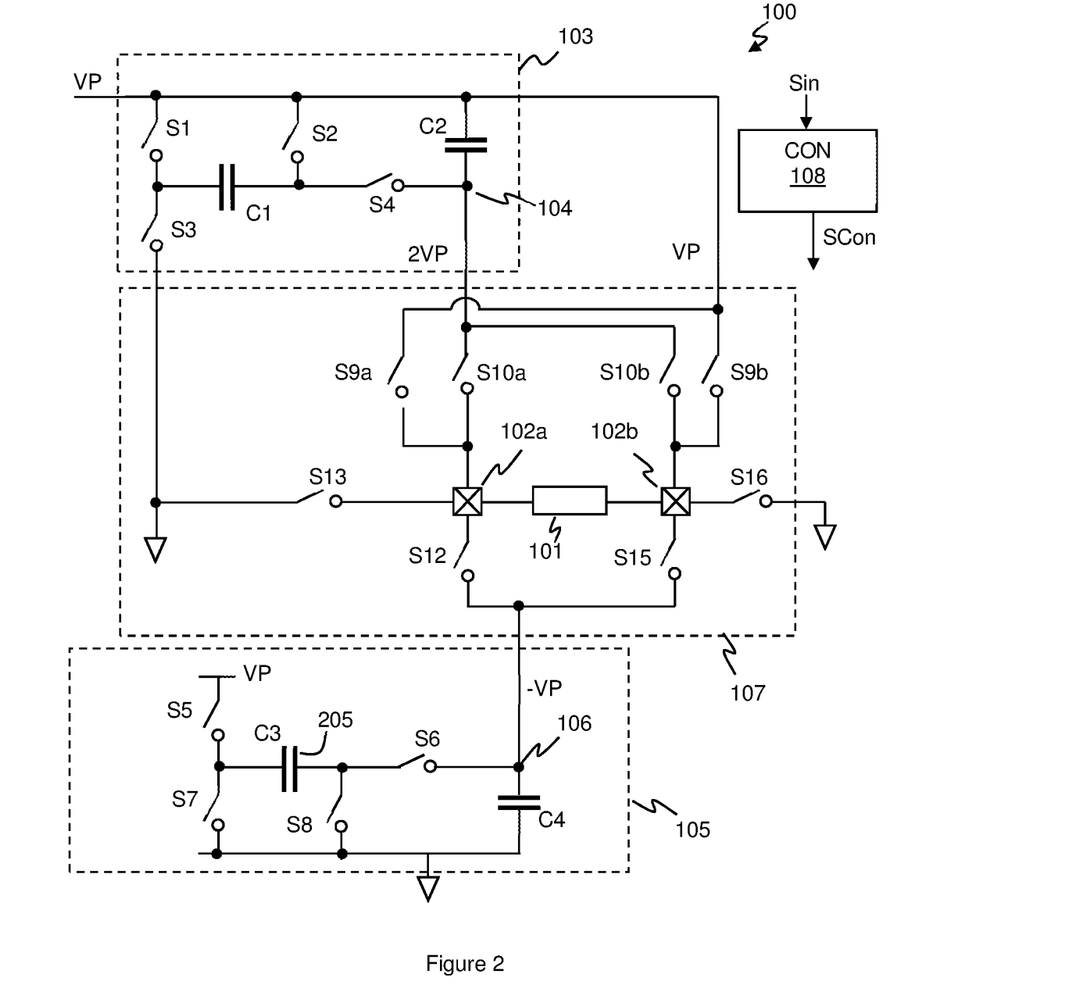
FIG. 2 illustrates another example of a driver apparatus according to an embodiment.

FIG. 2 illustrates another example of switching driver 100 according to an embodiment, in which similar components are identified by the same reference numerals. The switching driver 100 of the example of FIG. 2 comprises first and second charge pumps 103 and 105 as discussed with respect to FIG. 1 and an output bridge stage 107. However in the example of FIG. 2, rather than a single switch S9 for selectively supplying the supply voltage VP to the high-side rail, there are switches S9a and S9b for selectively supplying the supply voltage VP to the first and second output nodes 102a and 102b respectively. Likewise, rather than a single switch S10 for selectively supplying the boosted voltage 2VP to the high-side rail, there are switches S10a and S10b for selectively supplying the boosted voltage 2VP to the first and second output nodes 102a and 102b respectively. Switches S11 and S14 discussed with reference to FIG. 1 are not required and can be omitted, and thus the output bridge stage 107 of the example of FIG. 2 can be implemented with the same number of switches as the example of FIG. 1.

The embodiment of FIG. 2 can thus be controlled to implement Mode 1 and Mode 3 as discussed with reference to FIG. 1. For example, S9a and S13 being switched in antiphase with a controlled duty-cycle to switch the first output node 102a between VP and 0V in Mode 1 and switches S10a and S9a being switched in antiphase with a controlled duty-cycle to switch the first output node 102a between 2VP and VP in the positive sub-mode of Mode 3. Switches S9b and S10b (and S16) could be controlled similarly for the second output node 102b. In addition, the embodiment of FIG. 2 can be controlled to implement either the intermediate signal level Mode 2a discussed with reference to FIG. 1, or the alternative intermediate signal level Mode 2b.

In some implementations, the controller 108 may be configured to generally operate in a defined one or the other of Mode 2a and Mode 2b for signal levels between the first and second thresholds, i.e. the relevant intermediate signal level mode may be predetermined. In some cases, however, it may be advantageous for the controller 108 to be able to select an appropriate one of the intermediate signal level modes, i.e. to choose to operate in Mode 2a or Mode 2b for appropriate signal levels. The controller 108 may select which intermediate signal level mode to operate in based on operating conditions, which may for example include load demand of the first or second charge pumps, particularly if the charge pumps are shared with other output bridge stages for other channels as discussed below.

The example of FIG. 2 can allow either of the intermediate signal level modes, Mode 2a or Mode 2b to be implemented, as each of the first and second output nodes 102a and 102b can be selectively and independently connected to any of the four possible switching voltage nodes. Alternatively, if Mode 2b were the preferred intermediate signal level mode (and operation in Mode 2a were not required), the output bridge stage 107 could be implemented with switches S9a, S9b, S10a and S10b as discussed with reference to FIG. 2, but a common low-side rail could be used for 0V and −VP, i.e. switch S13 could selectively connect ground to a common low-side rail and S12 could selectively connect −VP to the common low-side rail. In this case switches S15 and S16 could be repurposed to selectively connect the first and second output nodes 102a and 102b respectively to the common low-side rail.

In the examples of FIGS. 1 and 2 it would also be possible to implement an alternative to Mode 1, in which each of the output nodes 102a and 102b are switched, with a controlled duty cycle, between ground and −VP. However, this would generally be less efficient than Mode 1 as described which uses the received supply voltages.

In either of the embodiments of FIG. 1 or FIG. 2, in some implementations the first and second charge pumps 103 and 105 may be active to generate the relevant first or second boosted voltage in each of the operating modes, e.g. in each of Mode 1, Mode 2a (and/or Mode 2b) and Mode 3. When active, the switch network of the charge pump may be switched at a charge pump switching frequency so as to maintain the boosted voltage.

In some cases, the switching frequency of the first charge pump 103, when active, may be the same as the switching frequency of the second charge pump 105, when active, and the charge pumps may thus each receive a version of a common clock signal to control switching. The switching frequency of the charge pumps can be independent of the duty cycle of the output bridge stage.

In some implementations, however, the switching frequency of the first charge pump 103, when active, may be different to the switching frequency of the second charge pump 105 when active.

For example, consider that the controller 108 is configured to control the switching driver to selectively operate in Mode 1, Mode 2a or Mode 3 depending on the signal level (i.e. so that Mode 2b is not used). The second boosted voltage-VP is used as a switching voltage in each of Mode 2a and Mode 3, whereas the first boosted voltage +2VP is only used as a switching voltage in Mode 3. In Mode 2a, for signal magnitudes approaching the second threshold, the duty cycle of the output bridge stage may be such that the output of the second charge pump 105 is connected to the relevant output node for most of the switching cycle. The recharge rate of the hold capacitor C4 may therefore need to be relatively high to maintain the second boosted voltage. Mode 3 is only used for signal levels above the second threshold, and it will only be for the very highest signal levels, which may only occur rarely, that the output of the first charge pump 103 is connected to the relevant output node for the majority of the switching cycle. As such, it may be possible in some applications to use a lower switching frequency for the first charge pump, whilst maintaining an acceptable level of voltage droop at the output node 104 in use. This can be advantageous as a lower switching frequency may be more power efficient, e.g. in terms of reduced switching losses.

Alternatively, if the controller 108 were configured to operate the output bridge stage 107 in a selected one of Mode 1, Mode 2b or Mode 3 according to the input signal (i.e. not to use Mode 2a), then it will be understood that the first boosted voltage output of the first charge pump 103 is used as a switching voltage in both Mode 2b and Mode 3, but the second boosted voltage output of the second charge pump 105 is used as a switching voltage in Mode 3. In such case, the switching frequency of the second charge pump 105 could be lower than that of the first charge pump 103.

In some implementations, at least one of the first and second charge pumps may not be actively switched at the relevant charge pump frequency in some modes of operation, when the relevant boosted voltage is not being used as one of the switching voltages, so as to save power, e.g. in switching losses. For instance, when the switching driver 100 is operating in Mode 1, with both the first and second output nodes 102a and 102b being switching between the first and second supply voltages, the first and second boosted voltages are not used as switching voltages. In this case, at least one of the first and second charge pumps 103 and 105 may be inactive or may operate in only a relatively minimal manner to maintain an acceptable level of charge on the relevant hold capacitor. For instance, the charge pump could be operated at a relatively low frequency which is, for example, just sufficient to recharge the hold capacitor to account for leakage. In some examples, a control loop (e.g. of controller 108) could monitor the voltage at the output node of the relevant charge pump and only operate the charge pump to recharge the hold capacitor if the voltage at the output droops by more than a defined amount. This may keep the relevant hold capacitor substantially charged, so that the charge pump can be activated quickly, when required to provide one of the switching voltages in one of the other operating modes. Additionally or alternatively, the relevant charge pump could be activated just before it will be needed for operation in a particular mode, based on some look ahead of the signal, with the charge pump being activated with sufficient time for the relevant hold capacitor to become fully charged before the output is used as one of the switching voltages. In some examples the charge pump switching frequency of at least one of the first and second charge pumps 103 and 105 could also be variable based on a look ahead signal indicative of the input signal level so that the charge pump is operated at a frequency which is sufficient to keep the relevant hold capacitor sufficient charged given the anticipated load demand.

The controller 108 may thus, in some embodiments, also control activation of and/or the switching frequency of at least one of the first charge pump 103 and the second charge pump 105. As noted above this can improve power efficiency, e.g. through reduced switching losses.

Figure 3:
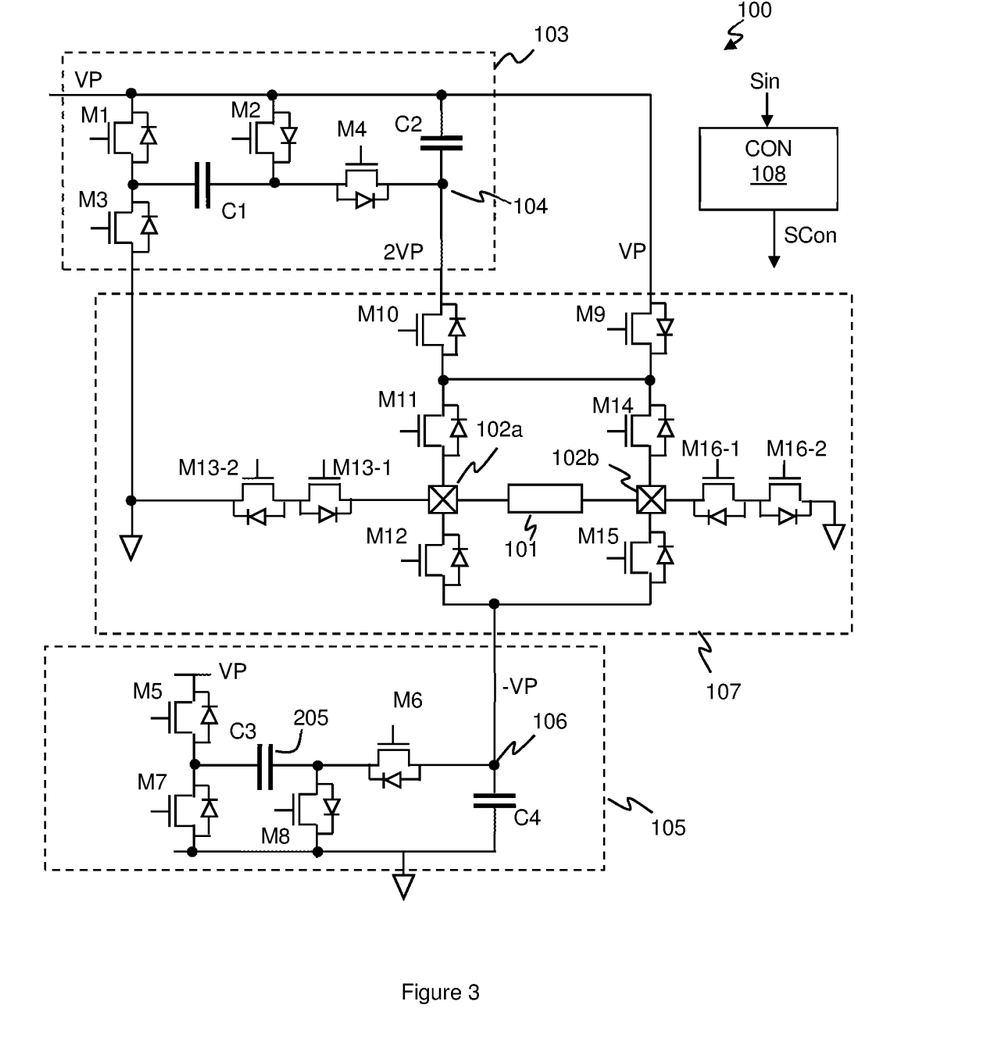
FIG. 3 illustrates an example implementation of the driver apparatus of FIG. 1.

Each of the switches of the switching driver 100 may be implemented by one or more suitable transistors, for instance by one or more MOS transistors. FIG. 3 illustrates one example of how the switching driver 100 of FIG. 1 could be implemented. Each of the switches S1-S4 of the first charge pump 103 and switches S5-S8 of the second charge pump 105 can be implemented by a suitable MOS transistor, indicated as M1-M8 respectively. FIG. 3 also shows that, as would be understood by one skilled in the art, each MOS transistor may have an associated body diode and the transistors are arranged to avoid unwanted conduction via the body diode when in the off state. The maximum voltage across any of the transistors M1 to M8 in normal operation will be equal to the input voltage VP.

Switches S9, S10, S11, S12, S14 and S15 can each also be implemented by a suitable MOS transistor, M9, M10, M11, M12, M14 or M15 respectively. The body diodes of transistors M9 and M10 are arranged in opposite orientations with respect to the high-side rail so that when transistor M9 is on and M10 is off, and the high-side rail is at VP, the body diode of M10 is reversed biased with respect to the 2VP voltage at the output of the first charge pump and that when transistor M10 is on and M9 off, and the high-side rail is at 2VP, the body diode of M9 is reversed biased with respect to the 2VP voltage at the high side rail. Switch S13 is, in this example, implemented by a pair of transistors, M13-1 and M13-2, with the body diodes in opposite orientations to one another, i.e. in a back-to-back arrangement, so that, when switch S13 is off at least of the body diodes is reverse biased whether the output node 102a is connected to a positive voltage at the high-side rail or to a negative voltage at the low-side rail. Likewise switch S16 is implemented by a pair of back-to-back transistors M16-1 and M16-2.

The example of FIG. 3 can thus be implemented with just eighteen transistors and just four capacitors C1-C4. Depending on the implementation, one or more of the capacitors C1 to C4 could be implemented as integrated capacitors in an integrated circuit implementation or one or more of the capacitors C1 to C4 could be implemented as an external, i.e. off-chip component.

In use, the maximum voltage across the transistors M9 and M10 may be equal to the input voltage VP, as the high side rail will either be at a voltage of 2VP or VP. However, the maximum voltage stress across M11 may be equal to 2VP, e.g. in a Mode 3 state where the high-side rail is driven to 2VP and the first output node is connected to ground. This is also the same for M14. Likewise the maximum voltage stress across the transistor pair M13-1 and M13-2 or the transistor pair M16-1 and M16-2 may be equal to 2VP, when the relevant output node is connected to 2VP. The maximum voltage stress across M12 may be equal to 3VP, e.g. in a Mode 3 state where the first output node 102a is driven to 2VP. Likewise the maximum voltage stress across M15 will be 3VP. Each of the transistors can be configured appropriately to withstand the maximum voltage stress that will be experienced in use.

The embodiment of FIG. 2 could be implemented in a similar manner as would be understood by one skilled in the art.

The switching driver 100 of embodiments of the disclosure is able to generate a driving voltage in the range of +3VP to −3VP with a relatively low bill-of-materials (BOM) and with a circuit that can be relatively small in terms of circuit area. As the first and second boosted voltages are generated by first and second charge pump that maintain the voltages with hold capacitors (which can be refreshed at a charge pump switching frequency independent of input signal), the relevant boosted voltage can be supplied to the relevant output node for most or all of a switching cycle without unacceptable voltage drooping.

In addition, in some applications there may be multiple drivers for driving multiple different channels. For example in an audio application there may be at least first and second audio channels, e.g. for driving right and left audio channels. Each channel may comprise a switching driver output bridge stage for outputting respective driver signals for the relevant load and at least one of the first and second charge pumps could be shared between the output bridge stages for the different channels. Such an arrangement can be very efficient in terms of circuit area and bill of materials.

The embodiments above have been discussed with reference to first and second supply voltages of a positive supply VP and ground. It will be understood that this is just one example however and the first and second supply voltages could both be non-zero voltages and/or at least one of the supply voltages could be a negative polarity supply.

The embodiments above have also been discussed with reference to switching driver for driving a load in a BTL arrangement. In some implementations the switching driver could be implemented as a single ended driver, e.g. by omitting switches S14, S15 and S16 of the output bridge stage of FIG. 1.

The driver apparatus of embodiments of the disclosure may be suitable for driving an output transducer. The output transducer may be, in some implementations, an audio output transducer such as a loudspeaker or the like. The output transducer may be a haptic output transducer. In some implementation the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver apparatus for driving a transducer in a bridge-tied-load configuration based on an input signal comprising:
   first and second input nodes for receiving first and second supply voltages respectively defining an input voltage;
   a first charge pump configured to generate a first boosted voltage which is positively boosted from the first supply voltage;
   a second charge pump configured to generate a second boosted voltage which is negatively boosted from the second supply voltage;
   an output bridge stage with first and second driver output nodes for connection to opposite sides of the load, wherein the output bridge stage comprises a switch network for selectively connecting each of the first and second driver output nodes to any of the first supply voltage, the second supply voltage, the first boosted voltage or the second boosted voltage; and
   a controller configured to control the switch network of the output bridge stage to selectively operate in each of:
      a first driver mode in which each of the first and second output nodes is modulated between the first and second supply voltage;
      a second driver mode in which one of the first and second output nodes is modulated between the first and second supply voltages and the other of the first and second output nodes is modulated between either the first boosted voltage and the first supply voltage or between the second supply voltage and the second boosted voltage; and
      a third driver mode in which one of the first and second output nodes is modulated between the first supply voltage and the first boosted voltage and the other of the first and second output node is modulated between the second supply voltage and the second boosted voltage;
   wherein the controller is configured to control the driver mode and a duty cycle of the modulation in said driver mode based on the input signal.

2. The driver apparatus of claim 1 wherein, in said second driver mode, one of the first and second output nodes is modulated between the first and second supply voltages and the other of the first and second output nodes is modulated between the second supply voltage and the second boosted voltage.

3. The driver apparatus of claim 2 wherein the controller is further operable to control the switch network of the output bridge stage to selectively operate in an alternative second driver mode in which one of the first and second output nodes is modulated between the first and second supply voltages and the other of the first and second output nodes is modulated between the first boosted voltage and the first supply voltage.

4. The driver apparatus of claim 1 wherein the first charge pump is configured to be operable, in use, with a first flying capacitor and a first hold capacitor and the second charge pump is configured to be operable, in use, with a second flying capacitor and a second hold capacitor.

5. The driver apparatus of claim 4 wherein each of the first and second charge pumps is configured to be operable in a charge state in which the respective first or second reservoir capacitor is charged to the input voltage and a refresh state in which the respective first or second reservoir capacitor is connected in series with the appropriate first or second supply voltage to generate the respective first or second boosted voltage at an output of the charge pump.

6. The driver apparatus of claim 5 wherein the first hold capacitor is connected between the output of the first charge pump and the first supply voltage.

7. The driver apparatus of claim 1 wherein, in use, a charge pump switching frequency of the first charge pump is different to a charge pump switching frequency of the second charge pump.

8. The driver apparatus of claim 1 wherein the controller is configured to controllably vary a charge pump switching frequency of at least one of the first and second charge pumps.

9. The driver apparatus of claim 1 wherein the controller is configured to control at least one of the first and second charge pumps such that, in at least one driver mode in which the relevant first or second boosted voltage is not used as a modulation voltage, a switching frequency of the first or second charge pump is lower than in a driver mode in which the relevant first or second boosted voltage is used as a modulation voltage.

10. The driver apparatus of claim 1 wherein the controller is configured to control at least one of the first and second charge pumps such that, in at least one driver mode in which the relevant first or second boosted voltage is not used as a modulation voltage, the first or second charge pump is deactivated.

11. The driver apparatus of claim 1 wherein the controller is configured to control activation of the at least one of the first and second charge pumps based on an indication of a look-ahead of the signal level of the input signal.

12. The driver apparatus of claim 1 wherein the switch network of the output bridge stage comprises, for each of the first and second output nodes, a first switch for selectively connecting the output node to a first rail node, a second switch for selectively connecting the output node to the second supply voltage and a third switch for selectively connecting the output node to a second rail node, wherein the second rail node is connected to an output of the second charge pump and the switch network of the output bridge further comprises switches for selectively connecting the first supply voltage or an output of the first charge pump to the first rail node.

13. The driver apparatus of claim 1 wherein the first supply voltage is a positive supply voltage equal to VP and the second supply voltage is a ground voltage.

14. The driver apparatus of claim 1 wherein the first boosted voltage is nominally equal to +2VP and the second boosted voltage is nominally equal to −VP.

15. The driver apparatus of claim 1 wherein the driver apparatus is an audio driver apparatus for driving an audio output transducer based on an audio input signal.

16. An integrated circuit comprising the driver apparatus of claim 1.

17. An electronic device comprising the driver apparatus of claim 1.

18. A driver apparatus for driving a load based on an input signal comprising:
- first and second supply nodes for connection to first and second supply voltages defining an input voltage;
- first and second charge pumps for generating, in use, first and second charge pump voltages that are different from the first and second supply voltages and which differ from the first and second supply voltages respectively by an amount equal to the input voltage;
- first and second driver output nodes for connection to opposite sides of the load;
- a controller configured to selectively modulate each of the first and second driver output nodes between selected switching voltage with a controlled duty cycle wherein the switching voltages for each of the first and second output nodes can be selected to be any of:
  - the first charge pump voltage and the first supply voltage;
  - the first supply voltage and the second supply voltage; or
  - the second supply voltage and second charge pump voltage.

19. A driver apparatus for driving a transducer based on an input signal comprising:
- first and second supply nodes for connection to first and second supply voltages defining an input voltage;
- first and second charge pumps for generating, in use, first and second charge pump voltages that are different from the first and second supply voltages;
- a controller configured to selectively modulate at least one driver output node between selected ones of the first charge pump voltage, the first supply voltage, the second supply voltage and the second charge pump voltage.

\* \* \* \* \*